United States Patent [19]
Quellette

[11] 3,950,731
[45] Apr. 13, 1976

[54] DATA PROCESSING ARRANGEMENT FOR PRINTERS

[75] Inventor: Maurice J. Quellette, Waynesboro, Va.

[73] Assignee: General Electric Company, Waynesboro, Va.

[22] Filed: Dec. 26, 1973

[21] Appl. No.: 428,366

[52] U.S. Cl......... 340/172.5; 340/147 LP; 178/23 R
[51] Int. Cl.² .......................................... G06F 3/12
[58] Field of Search....... 340/172.5, 147 LP, 147 C; 178/23 R; 328/104

[56] References Cited
UNITED STATES PATENTS

| | | |
|---|---|---|
| 3,105,197 | 9/1963 | Aiken .............................. 328/104 |
| 3,466,605 | 9/1969 | Schoenwitz ...................... 178/23 R |
| 3,493,928 | 2/1970 | Juliusburger .................... 178/23 R |
| 3,639,904 | 2/1972 | Arulpragasam ............... 340/147 LP |
| 3,757,301 | 9/1973 | Regan et al. .................. 340/147 LP |

Primary Examiner—Joseph M. Thesz, Jr.
Attorney, Agent, or Firm—Michael Masnik

[57] ABSTRACT

A data interface between a plurality of data sources and a printer wherein the interface can accept data from such sources on a pre-established priority basis. The priority of any source is determined by the time relationship of its bid strobe signal to a synchronizing signal. The bid strobe signals are timed to occur at different time intervals in accordance with the pre-established priority basis.

12 Claims, 6 Drawing Figures

Figure 6:
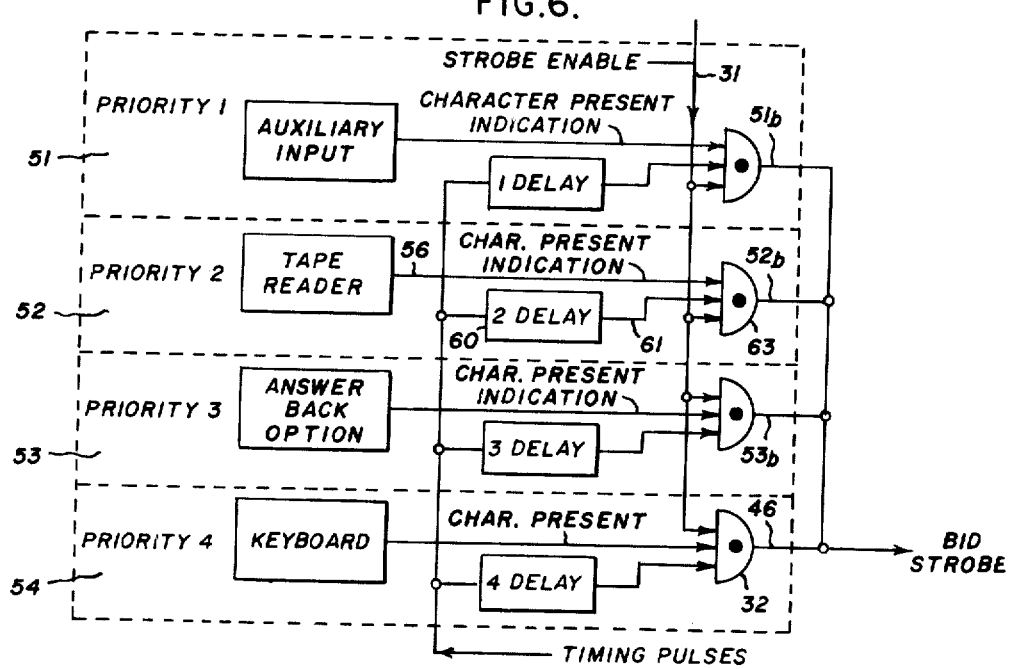

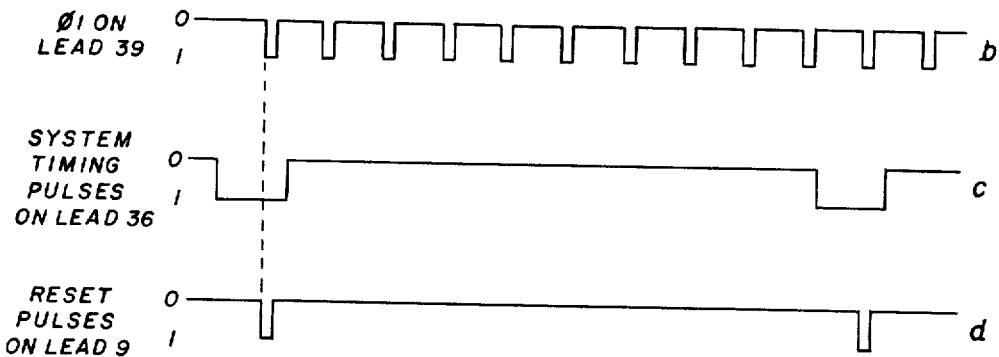
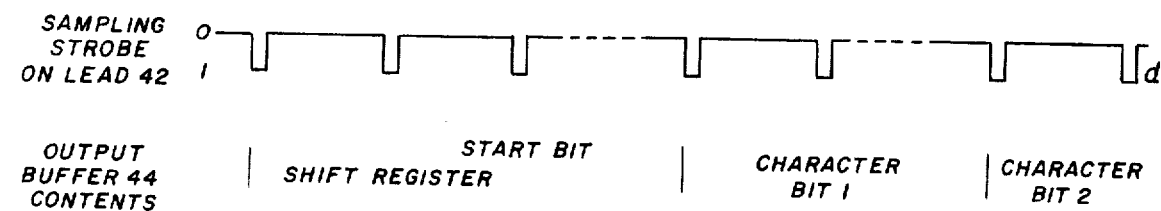

and FIG. 6 illustrates in block diagram form the details of a data processing arrangement in accordance with another feature of the present invention.

DATA PROCESSING ARRANGEMENT FOR PRINTERS

BACKGROUND OF THE INVENTION

This invention related to electronic printers and particularly to methods and means for preparing and processing a plurality of data concurrently originated by a keyboard or available from a plurality of sources prior to application to the printer to control printing of desired characters.

In the field of printers, characters are printed in response to input data available from a plurality of sources such as a keyboard, tape reader, answerback option or other sources such as CRT's, computers, etc. The data is generally available in the form of binary coded digital signals representative of characters to be printed or control functions to be executed. The control functions are related to proper printing operation and include such functions as line feed, carriage return, etc. In normal or usual operations, no problems are encountered because each character of data is available separately for utilization by the printer. Problems occur when a plurality of characters are concurrently available from a plurality of sources feeding into a common printer. The problem is complicated by the fact that since the individual bits associated with a particular character are of finite duration, the overlap of bits corresponding to different characters can lead to the printing of incorrect characters or to the loss of characters in the printout.

The problems become further complicated when it is desirable to synchronize signals available from individual sources which may change at any instant of time to a system wherein all signals may change only at discrete time intervals such as in a dynamic logic arrangement. Further difficulties arise when transferring a group of related bits of information from one part of a circuit to another. The transfer may be parallel, each data bit being presented simultaneously on separate lines. It may be serial in which all bits are presented on the same line one at a time. If more than one data source is active on the data line at one time, a merging of data may result, thereby destroying that data.

Accordingly, it is one object of this invention to provide an improved arrangement for utilizing data available from a plurality of sources in a simple and efficient manner.

It is a further object of this invention to provide an improved system whereby a group of asynchronous signals may be synchronized to the dynamic logic used in printer operation without the use of special or multiple synchronizing circuits.

It is a further object of this invention to provide a system of data transfer which is serial, whereby several data sources may be placed on one data line. These data sources are assigned a priority sequence such that no data merging may occur.

A further object of this invention is to provide an improved processing arrangement for use with digital data.

Figure 1:
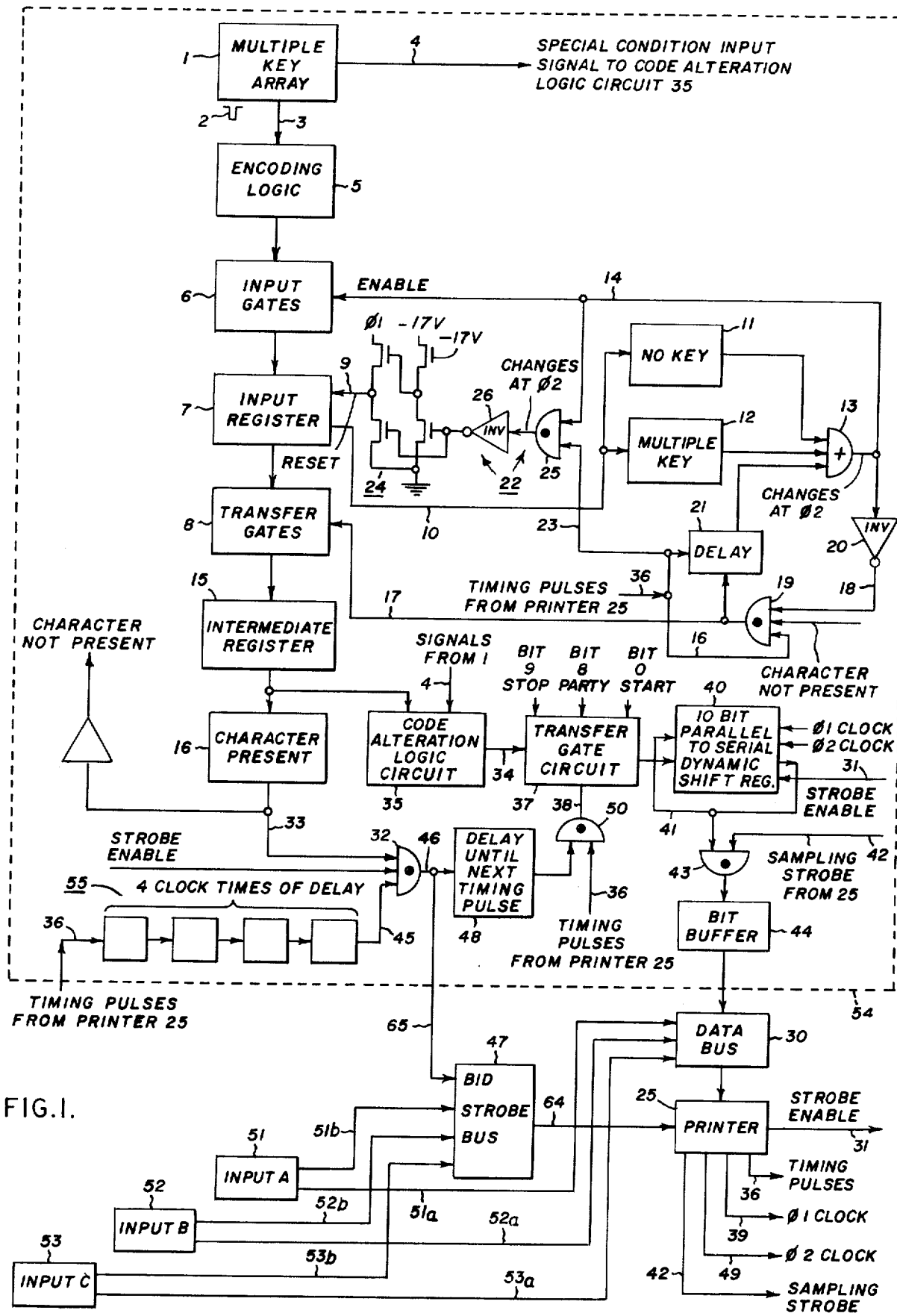

The aforementioned general object and various features of the present invention will become more clearly appreciated from the following description of a particular illustrative embodiment which is made in conjunction with the accompanying drawings wherein:

FIG. 1 shows in block diagram form one embodiment of the present invention;

FIGS. 2 through 5 present wave forms useful in explaining the operation of the present invention; and FIG. 6 illustrates in block diagram form the details of a data processing arrangement in accordance with another feature of the present invention.

In accordance with one aspect of the invention, conversion of input data signals, which are asynchronous to the logic system clocks, to synchronized signals is achieved by gating with synchronized control lines in an improved manner which enable data transfers only at synchronous times.

In accordance with a still further aspect of the invention, a data interface system for transfer of digital data from a keyboard or other similar data source to other sections of the printer involves a data sampling technique. This interface at the central or receiving side can accept data from any of several input sources on a pre-established priority basis. The priority of an input device is determined by the time relationship of its character indicating signal to a synchronizing signal. The actual data transfer is accomplished in a serial manner. The data is sampled from a dynamic shift register into an output latch by a signal whose timing can be controlled so as to successively sample each character location or stage of the shift register at any desired rate and where each location represents one bit of the character to be transferred.

Before turning to a detailed description of the preferred embodiment illustrated in FIG. 1, it will be necessary to set forth a few preliminary remarks concerning digital logic systems. In such systems there are two distinct signal levels. One of these signal levels will be referred to hereinafter as logic 1 and may be represented by a relatively low voltage such as −5 volts. The other logic level will be referred to as a logic 0 and will be represented by a higher voltage such as 0 volts. Throughout the specification reference will be made to a lead. This is intended to mean either a single or plurality of connections or couplings depending upon whether a signal involves single or a plurality of signal components. An example of the latter is data in bit parallel format. In the embodiment illustrated in the drawings there are shown a number of common logic elements whose operation will be described briefly. A logic element denoted with reference numeral 19 is a simple AND gate. AND gate 19 may have any number of inputs (designated by the arrows). The operation of AND gate is such that its output will go to logic 1 if, and only if, all the inputs are at logic 1. Under all other input conditions, the output of AND gate will be logic 0. The logic symbol denoted by reference numeral 20 is a simple inverter. As is well known, inverter 20 operates such that its output (denoted by the circle) will be a logic 1 when its input (denoted by the arrow) is a logic 0 and vice versa. The logic element denoted with reference numeral 13 is a simple OR gate. OR gate 13 operates such that its output will be a logic 1 if any one or more of its inputs are logic 1. Since the synchronizing of keyboard generated data is to be described with respect to a dynamic logic system, it may be well to point out the features of this system. In a particular embodiment, reference will be made to a two phase dynamic system of clocking for controlling the operation of the printer. In such an arrangement all logic signals are only permitted to change state at the leading edge of the phase 2 clock signal. One embodiment, shown by way of example in FIG. 2a, utilized phase 2 clock pulses in the form of a square wave of 10 microseconds duration with a negative going 6.25 microseconds pulse portion. Phase 1 clock pulses are permitted to occur only during the positive going portion of phase 2 clock pulses and are utilized to provide desired delays in signals which normally change at phase 2. The phase 1 negative going pulses in such embodiment are of 1.25 microsecond duration. In addition to these clock pulses, system timing pulses, are represented by a 100 microsecond square wave with a 10 microsecond negative going portion, FIG. 2c, are employed. These are utilized to synchronize the various parts of the system. The usefulness of these various pulses will be described shortly.

It may be desirable to briefly review the general function of the circuit of FIG. 1 to facilitate later, more detailed explanation. Keyboard 1 outputs a brief pulse on a pair of leads in response to the depressing of a key representing the letter A, which is independent of the duration that the key remains depressed. Lead 3 actually represents a plurality of leads in two groups wherein each key addresses a unique pair of leads, one from each group. When applied to circuit 5, the pulse pairs result in a 7 bit binary signal representing the character A being applied through normally open gates 6 to the input register 7. Gates 8 are normally closed. This 7 bit signal in 7 is evaluated by blocks 11 and 12 to determine whether it is a valid or invalid signal. An invalid signal is one which is determined to represent a no key depression or a multiple key depression. If the character is invalid, 11 and 12 operate to provide an enable signal as shown in FIG. 5e to gates 6 in order for register 7 to receive the next character. If a first data is found to be valid, gates 6 are disabled or blocked and 7 remains uncleared. Upon the occurrence of the first system timing pulse following the last key operation, gates 8 are opened for the duration of one system timing pulse, and the first data transferred from 7 to 15 provided the second register 15 is empty of data. If 15 is not empty, the transfer will be delayed until 15 is empty. At the occurrence of the second system timing pulse following key operation, register 7 is reset or cleared of stored first data, gates 6 opened and 7 made available to receive new data. Gates 37 are normally closed blocking data from being processed and applied from 15 and 35 to printer 25 to effect printer operation in accordance with the data. When block 16 signals that register 15 has the first data stored therein, gates 37 are opened to apply the first data stored in 15 to the circulating shift register 40. In 40, the first data now equipped with start, stop and parity bits is circulated in bit serial form and applied to printer 25 in bit serial form at desired times established by Sampling Strobe signals available on lead 42 from printer 25. When the printer accepts the last bit associated with the data circulating in 40, the first data in 40 is erased by a Strobe Enable signal developed by 25. The gates 37 were opened only long enough to enable the data in 15 to be applied to 40 and then closed. Register 40 must wait therefore until the second data appears in 15, is sensed by 16 and gates 37 opened to transfer the second data to 40 and then on to the printer. Printer 25 can also receive data from sources 51, 52 and 53 as well as the keyboard circuit 54. As will be described shortly, sources 51, 52, 53 and 54 are each assigned a priority for operating printer 25. This priority is defined by separate bid strobe signals being available at different times on leads 65, 51b, 52b and 53b. The priority is established by the time occurrence of the individual bid strobe signal. The bid strobe signal lead on 65 occurs 4 clock times after the occurrence of a system timing pulse available from the printer on lead 36. That on 53b — 3 clock times after, on 52b — 2 clock times and that on 51b — 1 clock time after the occurrence of such system timing pulse. Block 47 responds to only one of the bid strobe signals being applied thereto.

Referring to FIG. 1 there is shown a multiple key array or keyboard 1 which produces a negative going pulse 2 on its output lead 3 in response to the depression of a key associated with a printable character. In one particular embodiment, the keyboard is operated using well known Hall-effect principles to produce a short duration pulse only in response to the depressing of a key such that duration of the pulse is independent of the duration of the pressing of the paticular key. In one particular embodiment, depressing a printable character key caused it to output a 10 microsecond to 100 microsecond pulse. The significant factor is that the pulse width is small compared to the typing rate of an operator during rollover typing (of the order of 10 milliseconds). This makes the pulse at its largest only 1 percent of the rollover typing rate. The variation in pulse width is attributable to the nature of the signal producing circuit used with the Hall-effect element. Further details of the rollover problem and how it is solved will be described shortly.

Array 1 also produces a special condition input signal at logic level 1 for the duration of the depression of any key. These signals on lead 4 are generated in response to operation of a key representing a code alteration, such as a control function, lower or upper case printing, repeat, etc., and will be described in greater detail shortly.

The output pulses on lead 3 are encoded in the encoding logic circuit 5 into unique 7 bit binary signals representative of the printable characters associated with the keys depressed. Gates 6 are normally open to pass the encoded signals available from 5 to the input register 7 for storage therein in binary digital form. Input register 7 is a well known circuit involving essentially a set of static latches which assume a state corresponding to the applied digital signals. The result is that the depression of a printable character key in 1 causes a digital signal representative of this character to be stored in the register 7 and appear at its output without substantially any delay.

Transfer gates 8 are normally blocked and the digital data stored in 7 remains there until a reset signal at logic level 1 is applied to lead 9. The signals stored in input register 7 are examined or sensed on leads 10 in order to determine whether or not the stored information designates a valid character. If the equipment is functioning properly, the cause of an invalid character will be a multiple key or no key condition, that is, a plurality of keys operating in an overlapping time sequence, or a no operated key condition. Detection circuits 12 and 11 are connected to register 7 and evaluate the stored data to determine whether or not there is a multiple key condition or a no operated key condition respectively. These circuits comprise well known comparator circuits as, for example, shown in greater detail in FIG. 7 of co-pending application Ser. No. 421,981 entitled "Method and Apparatus for controlling Circuitry With a Plurality of Switching Means", filed Apr. 23, 1971 Dec. 5, 1973 (continuation of Ser. No. 136,853 filed Apr. 23, 1971, now abandoned) in the name of David N. Sitter. If either condition is detected, the data in the register 7 is not processed because it is not a valid input. Since we are seeking valid data, OR gate 13 insures the production of an enable or logic 1 signal to the input gate 6 (see FIG. 5e) over lead 14 when these invalid code conditions appear in order to enable the next data to be applied to input register 7 for evaluation. If the data received from the keyboard is found to be valid, then the data is transferred through gates 8 to the intermediate register 15 as follows. At the occurrence of the next timing pulse following the storing of the data in regiser 7, transfer gates 8 are unblocked in response to an enable signal developed upon lead 17 provided a valid code signal is indicated on lead 18. Thus, when AND gate 19 gets a logic level 1 signal on lead 16 indicating the occurrence of a timing pulse and a logic level 1 signal on lead 18 indicating a valid code, then a logic 1 signal is developed on 17 to open gates 8 to transfer the data stored in register 7 to the intermediate register 15 (see FIG. 5h). Thereafter, input register 7 is to be reset, that is cleared of stored signals, and the input gates 6 opened (enabled) to admit the next character coming from the source 1. This is achieved by applying the output pulse available from 19 to circuit 21 which introduces a one system clock time delay (from X to Y) at the timing pulse rate as shown in graph (a) of FIG. 5. The timing pulse available from 21 is applied to OR gate 13 to produce a logic level 1 signal on the reset lead 9 after passage through 25 to cause the input register to be reset, that is cleared of its data, and a logic level 1 signal on enable lead 14 to cause the input gates to be enabled to receive the next character code.

Part of the circuitry described so far is also useful in overcoming the problem of rollover typing. The solution to this problem involves the ability to properly process (accept) a sequence of characters in the order in which keys are depressed, without regard to whether or not previously depressed keys have been released. One approach for implementing this function is to include in the keyboard electronics a memory which stored separate indications for all concurrently depressed keys. The contents of this memory can then be used to inhibit the output associated with this key after it has once been generated. An alternative approach is to use keys which output a temporary signal (pulse) only when first depressed along with generating a strobing signal during the pulse. These methods are costly or complex.

In the present invention the solution to the rollover problem, commonly referred to as N-key rollover, is, generally speaking, achieved in the following manner. Depressing a key in 1 causes it to output a short (10 microsecond to 100 microsecond) pulse as shown in FIG. 5b. This pulse is encoded into the appropriate code by 5 and this code stored in the input register 7. The input gates 6 are then disabled because of the absence of a no-key or a multiple key condition. When the first timing pulse X on 36 occurs, the character will be entered into the intermediate register 15 (see FIG. 5h). The second timing pulse Y will cause the input to be enabled once again at 6. The second timing pulse also causes the data to be transferred to the shift register 40 provided that the output is enabled at 31 by a signal such as 3c. The input is enabled to accept a second valid character at any time after the second timing pulse subsequent to the initial depression of the first key, whether or not the first key has been released. The time during which the input is inhibited after a character has been accepted must be at least as long as the longest possible duration of the pulse, in order that the same pulse not be accepted twice. It must also be small relative to the time between successive characters in a high rate burst of several characters in succession. Where the output rate is limited to a predetermined maximum, storage must be provided for accepting bursts of characters which may occur at a higher rate than that of the output.

In the printer 25 the above timing is generated from a free-running series of pulses of 10 microsecond duration occurring once each 100 microseconds. Smaller increments of time can be achieved by use of the phase 1 and phase 2 clocks used in the dynamic logic. The duration of phase 1 is 1.25 microsecond; the duration of phase 2 is 6.25 microseconds. For a no character or double character input, the input register is reset during the phase 1 portion of the timing pulse. Their time relationship is shown in FIG. 2. The input is disabled during this 10 microsecond timing pulse only, such that a pulse of any duration greater than 10 microseconds will be detected. This scheme enables the input to be disabled for a minimum amount of time during the reset.

Figure 5:
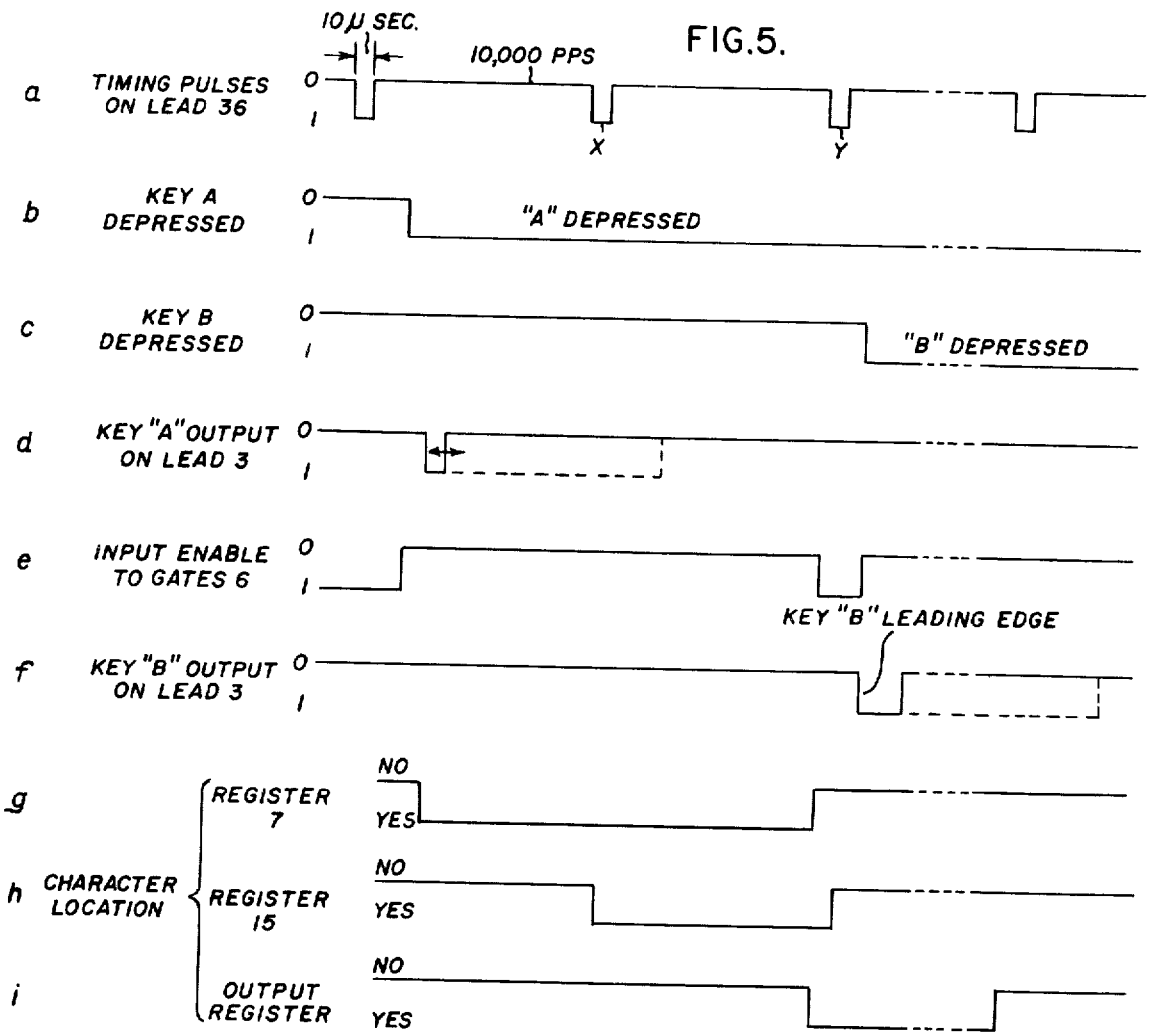

Synchronizing the data input to the phase 1 and phase 2 clocks is accomplished in the following manner. The data input must be stored as soon as it is detected, without regard to the clocks. This is accomplished in the input register 7. This data is not allowed to be entered during the system timing pulses. The first timing pulse after the data has been entered into register 7 will transfer this data into register 15 at a clock synchronized time. This transfer timing is depicted in FIG. 5. Whereas, the intermediate register 15 is a set of static latches, this transfer must take place without any undesired glitches which could inadvertently set these latches. This condition is avoided by the transfer timing. This timing is such that the data loading signal will occur only after the data has had a minimum of one dynamic clock time to settle. Also, in being delayed one clock time, the strobe signal is assured of being glitch-free.

The data output interface operates as follows. The interface involves seven signals, the System Timing pulses, the Bid Strobe signal which indicates that a character is to be transferred to the printer and its timing indicates the priority of the transfer, a Strobe Enable signal which enables Bid Strobe signals in accordance with the character present in the intermediate register and the priority of the source of such character relative to other character sources, Sampling Strobe signals which sample each character bit from the shift register 40 to the bit buffer 44, and the serial output data from buffer 44, and the phase 1 and phase 2 clocks which serve as the fundamental clocks control the operation of the system.

When a character is in the intermediate register and the Strobe Enable signal is on, a Bid Strobe is generated to indicate to the receiving side of the interface that a character is to be transferred. The printer 25 responds to the Bid Strobe to change the Strobe Enable to a zero state, inhibiting other data sources. On the system timing pulse following the Bid Strobe, the output dynamic shift register 40 is loaded with the bits of the character to be transferred. They then recirculate in this shift register until erased by the Strobe Enable signal returning to the 1 state upon transfer of data from buffer 44 to printer 25. While the character is recirculating in this shift register, the Sampling Strobe signal samples its contents. In this application, the sampling takes place as follows. The output data is to have the format of a serial asynchronous ASCII character. The first bit is therefore a character "start bit". At the beginning of the transfer, the Sampling Strobe signal will occur coincident with the System Timing pulse applying the start bit repeatedly into the output buffer 44. This will continue for the time duration of one character bit. At the time when character bit 1 is to be transmitted, the Sampling Strobe signal will change in time relation to the System Timing pulse. It will now occur one clock time later than the System Timing pulse, causing shift register bit 1 to be sampled into the output buffer. Thus, the time delay between the System Timing pulse and the Sampling Strobe signal determines which data bit will be transferred.

Summarizing therefore, the leading edges of the 7 bit coded signals available from circuit 7 are sensed to detect that they represent a valid character. A valid character is identified by circuit 11 as one which involves a depressed key, and by circuit 12 as not being a multiple key depression. Under these conditions of a valid code, these circuits 11 and 12 immediately remove the enable signal on 14 closing gates 6. This blocks the application of any immediately following character developed as the result of rollover typing for a given time interval. As shown, this interval varies from one to two system timing pulse periods. As shown in FIG. 5 the first system timing pulse X after the initial depression of a first key, causes the corresponding character data to be transferred from the Input Register 7 to the Intermediate Register 15. In FIG. 1, this timing pulse X is applied to Transfer Gates 8 over lead 17 to effect the transfer. In the arrangement of FIG. 1, this timing pulse X is delayed one timing pulse period in 21 before application to OR gate 13 whereupon it will cause an enable signal to once again be developed on lead 14 to open gates 6. Also it will cause circuit 22 to clear or reset Input Register 7 via lead 9 to receive the next data character. This approach prevents the same key depression from effecting multiple typing by the printer. Also this approach precludes the character data associated with a second key depression during rollover typing from being considered for typing until the data associated with the first key depression has been processed for printing. Essentially therefore narrow pulses are generated in response to key depression which pulses are narrower than the time interval between successive system timing pulses which in turn is dimensioned to be less than the 10 millisecond or so interval between successive key depressions as the result of rollover typing. The first timing pulse following the first key depression is employed to transfer character data associated with such first key depression to a second register. The second timing pulse is used to clear the first register and to enable gates for receiving the character data associated with the second key depression. The leading edges of the narrow pulses generated in response to key depression are used to establish the coded binary signals representing character data associated with each key depression.

The functioning of the control circuit 22 is now explained in greater detail. OR gate 13 produces a logic 1 signal at phase 2 clock time in response to a logic 1 signal available from no key circuit 11, the multiple key circuit 12, or the character transferred signal available from the gate circuit 6 of FIG. 1. At the same phase 2 clock time, AND gate 25 produces a logic level 1 output signal in response to a logic level signal 1 available on lead 14 and the occurrence of the timing pulse available on lead 23. The logic 1 signal is inverted in inverter 26 to produce a logic 0 at its output for application to the four transistor signal generator circuit 24 which produces a logic 1 on the reset lead 9 at phase 1 clock time. Generation of the reset pulse during the phase 1 clock time is illustrated in the wave forms of FIG. 2.

With the initially generated character in the intermediate register 15, gates 8 closed, and the input register reset, enable gates 6 then gate the next character to the input register 7 for evaluation. Under these circumstances if the data in 7 is determined to be valid, then the input gates 6 are closed. Because transfer gates 8 are closed, the data in 7 will not interfere with the data previously stored in the intermediate register 15. In response to the storing of data in register 15, a character present signal is developed in the block 16. This can be a flip-flop which is set in response to placing a character in register 15. As will be described shortly, the output of character present block 16 at logic level 1 is to be used to signal the printer 25 that character data is ready to be transferred to the data bus 30 for processing by the printer. In the event the data bus 30 already has data on it, the printer responds thereto and produces an output signal at logic level 0 on lead 31 which blocks the AND gate 32 to which the Strobe Enable signal on lead 31 and the character present signal on lead 33 are applied. Under these conditions the data stored in register 15 which is made available over lead 34 after processing in the code alteration logic circuit 35 under the control of a special condition input signals available on lead 4. Transfer gates 37 are normally closed in the absence of an Enable signal on lead 38 preventing the further application of the character data stored in intermediate register 15, and to the extent modified in logic circuit 35, from being applied to the data bus 30 by means of shift register 40, AND gate 43 and Bit Buffer 44. Gate circuit 37 receives the 7 bit character code from 35 and a start, stop and parity bit in the form of a zero level signal, one level signal and a zero level signal, respectively, from individual voltage sources. It gates these signals in parallel as a 10 bit ASCII code to register 40 and under control of signals from AND gate 50. While transfer gates 37 remain blocked, the data from 15 previously stored in the serial dynamic shift register 40 is circulated in serial bit form as indicated by the feedback line 41. At each Sampling Strobe time established by the signals available on lead 42 from the printer 25, AND gate 43 responds to the particular bit occurring at the output of the shift register during the Sampling Strobe time to set the state of the Bit Buffer 44 for application over data bus 30 to the printer for processing. The Sampling Strobe signal available on lead 42 and associated with the ten bit times of the character circulating in register 40 controls the transfer of the data.

FIG. 2 illustrates graphically the relative timing of the phase 1 and phase 2 clocks developed by the printer 25 on leads 39 and 49 and the system timing pulses developed on lead 36. There is also shown an example of a reset signal or pulse being developed on lead 9 during the phase 1 portion of a system timing pulse dependent on a signal being developed on lead 14 indicating that an invalid character has been detected at the output of Input Register 7 or that a valid character has been transferred from Register 7 to the Intermediate Register 15.

FIG. 3 illustrates graphically how the interval between system timing pulses is assigned time slots 1 through 4 (out of a possible 9 time slots) based on priority to the various character data sources 51, 52, 53 and 54. In particular the tape reader time slot 2 is shown along with the associated Bid Strobe signal developed on lead 52b and the Strobe Enable signal produced by printer 25.

FIG. 4 illustrates graphically how the character data is sampled out of shift register 40 into the Bit Buffer 44 for application to the printer 25 via the Data Bus 30 to effect printing fof characters and the execution of control functions associated therewith.

FIG. 5 illustrates graphically the relative timing of the system timing pulses developed by the printer 25 and the response of the Input Gates 6, the Input and Intermediate Registers 7 and 15 and Shift Register 40 to an output signal developed by the multiple key array 1. In a particular embodiment the timing pulses were of 10 microsecond duration and occurred at a periodic rate of 10,000 pulses per second.

FIG. 4 also shows the time relationship between the sampling strobe pulses available on lead 42 and the system timing pulses available on lead 36 for different character bit times. When the printer 25 accepts the last bit associated with the character last circulating in the shift register 40, a strobe enable logic level 1 signal is developed by the printer 25 on lead 31. For the time being, let us assume that there is also a logic level 1 signal developed on lead 45. Under these circumstances with a logic level ·1 signal in 16 indicating a character present in register 15, AND gate 32 produces a logic level 1 signal at its output lead 46. This logic level 1 signal appears at the bid strobe bus 47 which signals the printer that there is a further character in the intermediate storage register 15 ready to be transferred to the printer. Logic level 1 signal on lead 46 is stored in flip-flop 48 until the next timing pulse is available on lead 36. AND gate 50 responds to the output of the flip-flop 48 and the timing pulse on 36 to apply an enabling signal over lead 38 to the transfer gate 37 to transfer the data stored in 15 as modified by 35 in parallel form to the parallel to serial dynamic shift register 40 where it is circulated in serial bit form as previously explained. Sampling strobe signals available on lead 42 now apply the respective bits of the character circulating in register 40 through the bit buffer 44 to the data bus 30 for utilization by printer 25. The application of the data stored in 40 to printer 25 continues as previously explained until the sampling strobe associated with the tenth character bit occurs whereupon the output register is erased by the Strobe Enable signal on lead 31. The transfer gate 37 was opened only sufficiently long to enable the data to be transferred from the intermediate register to the shift register 40. The register 40 must await the next opening of gates 37 under control signals on lead 38 before making the next character data available to the printer.

So far we have described the operation of the invention for character data available from a single source, namely a keyboard circuit 54. In the event more than one source of signals is available, as for example as shown in FIG. 6, wherein in addition to the keyboard generated data signal source 54, an answer-back option data source 53, a tape reader 52 signal source and an auxiliary input source 51 such as CRT display or a computer are provided. In the situation where all of the data available from the various sources are not of the highest priority, it is desirable under certain circumstances to permit printing of data available from a low priority source until a higher priority source makes known its intention of having a message printed. Under these circumstances, the higher priority source would take precedence over the lower priority source to have its message printed. The lower priority source data, of course, would then be lost. This feature is shown in FIG. 1 wherein the various sources are shown as 51, 52, 53 and 54 in which priority of the three sources are of higher priority in descending numerical order. Each of the sources 51, 52 and 53 comprise circuitry to convert data into a format corresponding to that available from 44 and present it on leads 51a, 52a, 53a and also to provide Bid Strobe signals on leads 51b, 52b and 53b corresponding to that available on lead 46. These sources use the common bid strobe bus 47 and the data bus 30 for controlling the application of data to the printer 25. Let us assume that the only source generating character data is source 54. Under the circumstances as shown in FIG. 1, the AND gate 32 was indicated to respond when logic level 1 signals were available on 31 and 33 and also 45 in order to produce a Bid Strobe signal on bus 47. A logic level 1 or priority signal would be produced on lead 45 in response to a timing pulse available on lead 36 after being delayed for four system clock times in delay circuit 55. Let us next assume that the tape reader associated with block 52 begins to produce a character data resulting in a character indication signal being developed on lead 56. A timing pulse available on lead 36, after being delayed two phase 2 clock time periods in 60 appears as a timing or priority signal on lead 61 for application to AND gate 63 along with the character indication signal available from the associated tape reader. Since the keyboard had started transmitting character data before the tape reader did and the printer has responded to this data by blocking the application of a Strobe Enable signal to lead 31 until the particular character on the data bus and associated with the keyboard operation has been completely accepted by the printer 25, the AND gate 63 cannot respond to provide a related Bid Strobe signal on lead 64 to bus 47. When this particular character has been completely accepted, then the Strobe Enable signal appears on lead 31. Since the first character data to be next presented is that available from the tape reader two phase 2 clock times following the timing pulse (see FIG. 3), the related Bid Strobe signal generated by the tape reader is passed through the AND gate 63 via the bid strobe bus 47 to printer 25. Immediately, the Strobe Enable signal available from printer 25 on 31 is removed such that when the next keyboard signal available four phase 2 clock times after the timing pulse appears at its AND gate 32, it is prevented from being operated on by the printer. In a similar way, the output available from block 51 would take priority over the outputs from 52, 53 and 54 since it is presented to its AND gate one phase 2 clock time after the timing pulse, thereby blocking the processing of the data available from the other sources during subsequent phase 2 clock times until the data associated with the last Bid Strobe signal has been completely accepted by the printer and the Strobe Enable signal returns to lead 31. The manner in which the signals available on leads 31, 36, 39, 49 and 42 are developed by the printer 25 form no part of this invention. The printer may be viewed generally as a source of such timing and control signals. The FIGS. 2 through 5 illustrate the relative timing and duration of these signals.

What I claim as new and desire to secure by Letters Patent of the United States is:

1. An arrangement for selectively transferring character representing signals from a plurality of sources to a printer for utilization thereby comprising means for providing a strobe enable signal indicating that the printer is to receive a character representing signal, a source of system timing pulses, means responsive to said system timing pulses for providing a respective priority signal for each signal source wherein such priority signals are of substantially brief duration and occur at different non-overlapping discrete time periods during the interval between two successive system timing pulses, means coupled to each source for providing a character present signal in response to the availability therefrom of a character representing signal, means responsive after each system timing pulse to a following strobe enable signal and a character present signal associated with the priority signal occurring closest in time to said last named mentioned timing pulse for removing said strobe enable signal, and means for transferring the character representing signals associated with said last named priority signal to said printer following the occurrence of the next system timing pulse.

2. In combination, a plurality of sources of binary coded signals representing characters useful in controlling the operation of a printer, means for selectively transferring signals from such sources to said printer to control operation thereof in accordance with a given priority, a source of system timing pulses, means comprising said printer for providing a strobe enable signal whenever said printer is ready to receive binary coded signals, means responsive to each system timing pulse for producing a respective priority signal for each signal source wherein such priority signals are of substantially brief duration and occur at different, discrete time periods during the interval between two successive system timing pulses, means coupled to each source for producing a character present signal in response to the availability therefrom of a character representing signal, means responsive following the occurrence of a system timing pulse to the occurrence of a strobe enable signal and the character present signal associated with the priority signal occurring closest in time to said last mentioned timing pulse for eliminating said strobe enable signal, means for transferring the binary coded signals associated with said last named priority signal to said printer following the occurrence of the next system timing pulse, and means responsive to the completion of transfer of said binary coded signals to said printer to produce said Strobe enable signal.

3. An arrangement for processing binary coded signals available from a plurality of sources comprising a respective register for each source, means for transferring said binary coded signals from each of said sources to its respective register, means responsive to binary coded signals being present in any of said output registers for producing respective character present signals, a source of periodic timing pulses, means for delaying each of said periodic timing pulses to produce a respective non-overlapping time delayed pulse for each of said sources during the time interval between two successive timing pulses wherein the time delays of said time delayed pulses are different, means responsive to the simultaneous occurrence of a time delayed pulse and an associated character present signal for producing a respective bid strobe signal, and means responsive to the first occurring bid strobe signal following the occurrence of a timing pulse for blocking processing of binary coded signals associated with the other time delayed pulses occurring after the time delayed pulse associated with said first occurring bid strobe signal.

4. An arrangement according to claim 3 wherein said last named means comprises means responsive to said first occurring bid strobe signal for blocking production of bid strobe signals associated with the other time delayed pulses.

5. In combination a first and second source of character representing binary coded signals, a respective storage register for each source, means for transferring said binary coded signals from each of said sources to its respective register, means responsive to the binary coded signals being present in one of said registers for producing a first character present signal, means responsive to binary coded signals being present in the other of said registers for producing a second character present signal, a source of periodic timing pulses, means responsive to said periodic timing pulses to produce first and second non-overlapping time delayed pulses wherein the time delays of said first and second pulses are fixed with respect to a common reference time, means adapted to respond to the simultaneous occurrence of a first delayed pulse and a first character present signal for producing a first bid strobe signal, means adapted to respond to the simultaneous occurrence of a second delayed pulse and a second character present signal for producing a second bid strobe signal, a printer having a common circuit adapted to respond to bid strobe signals for accepting characters represented by the binary coded signals associated therewith, and means responsive to the first to occur of said bid strobe signals for blocking the production of a second to occur of said bid strobe signals until the binary coded signals associated with said first to occur of said bid strobe signals have been accepted by said printer.

6. An arrangement according to claim 5 further comprising a dynamic shift register associated with each source and means for transferring said binary coded signals from each of said storage registers in bit serial, character serial form to a respective shift register under control of said periodic timing pulses, and said printer having a common circuit adapted to respond to bid strobe signals for accepting characters represented by the binary coded signals associated therewith from said dynamic shift register.

7. An arrangement for selectively transferring printing and control function representing signals from a plurality of sources to a printer for executing the functions thereof comprising means for providing recurrent strobe signals whenever the printer is prepared to receive a function representing signal,
   a source of periodic system timing pulses,
   means responsive to said system timing pulses for providing respective, recurrent priority signals for each signal source wherein such priority signals are of substantially brief duration and occur at different non-overlapping discrete time periods during the interval between a plurality of successive system timing pulses,
   means coupled to each source for providing a function present signal in response to the availability therefrom of a function representing signal,
   means responsive after a system timing pulse to the occurrence of a following strobe enable signal and a function present signal associated with the priority signal occurring within a predetermined time after said last mentioned timing pulse for causing said first mentioned means not to provide a strobe enable signal,
   and means for transferring the function representing signals associated with said last mentioned priority signal to said printer following the occurrence of a given number of system timing pulses.

8. In combination, a plurality of sources of binary coded signals representing characters useful in controlling the operation of a printer and means for selectively transferring signals from such sources to said printer to control operation thereof in accordance with a given priority comprising,
   a source of periodic system timing pulses,
   means for providing a strobe enable signal whenever said printer is ready to receive binary coded signals,
   means responsive to each system timing pulse for producing a respective priority signal for each signal source wherein such priority signals are of substantially brief duration and occur at different, discrete time periods during the interval between two successive system timing pulses,
   means coupled to each source for producing a character present signal in response to the availability therefrom of a character representing signal,
   means responsive following the occurrence of a system timing pulse to the occurrence of a strobe enable signal and the character present signal associated with the priority signal occurring closest in time to said last mentioned timing pulse for causing said second mentioned means not to provide said strobe enable signal,
   means for transferring the binary coded signals associated with said last named priority signal to said printer following the occurrence of the next system timing pulse,
   and means responsive to the completion of transfer of said binary coded signals to said printer to cause said second mentioned means to produce said strobe enable signal.

9. A printer for processing binary coded signals simultaneously available from a plurality of sources comprising a respective binary coded signal storage device for each source,
   means for providing a strobe enable signal whenever said printer is prepared to receive binary coded signals for processing,
   means for transferring said binary coded signals from each of said sources to its respective device,
   means responsive to binary coded signals being present in any of said devices for producing respective character present signals,
   a source of periodic timing pulses,
   means responsive to said system timing pulses for providing non-overlapping respective priority signals for each of said sources during the time interval between two successive timing pulses wherein the time occurrences of said priority signals are different,
   means responsive to the simultaneous occurrence of a priority signal and an associated character present signal for producing a respective bid strobe signal,
   and means comprising a common line for applying bid strobe signals to said printer, said printer responsive to an applied, first occurring bid strobe signal following the occurrence of a timing pulse for blocking processing of binary coded signals associated with the other priority signals occurring after the priority signal associated with said first occurring bid strobe signal.

10. A printer according to claim 9 further comprising a dynamic shift register associated with each source, and means under control of said periodic timing pulses for transferring said binary coded signals from each of said storage devices to a respective shift register in bit serial, character serial form and from said shift register to said printer in bit parallel, character serial form.

11. An arrangement for selectively transferring synchronously related character representing signals from a plurality of sources to a printer for utilization thereby whenever a recurrent strobe enable signal is provided indicating that the printer is prepared to receive a character representing signal comprising,
    a source of periodic system timing pulses,
    means responsive to said system timing pulses for providing respective recurrent priority signals for each signal source wherein such priority signals are of substantially brief duration and occur at different non-overlapping discrete time periods during the interval between two successive system timing pulses,
    means coupled to each source for providing a character present signal in response to the availability therefrom of a character representing signal,
    means responsive after a first system timing pulse to the occurrence of a following strobe enable signal and a character present signal associated with the priority signal occurring closest in time to said last mentioned timing pulse for removing said strobe enable signal,
    means comprising a dynamic shift register for converting the character representing signals associated with said last named priority signal from parallel to serial form and for transferring said converted signals to said printer following the occurrence of the second system timing pulse following said first timing pulse,
    and means responsive to completion of said last named data transfer for restoring said strobe enable signal.

12. In combination, a plurality of sources of binary coded signals representing characters useful in controlling the operation of a printer,
first means for selectively transferring signals from such sources to said printer to control operation thereof in accordance with a given priority,
a source of recurrent system timing pulses,
second means comprising said printer for providing a strobe enable signal whenever said printer is ready to receive binary coded signals,
third means responsive to each system timing pulse for producing a respective priority signal for each signal source wherein such priority signals are of substantially brief duration and occur at different, non-overlapping discrete time periods during an interval defined by a plurality of successive system timing pulses,
fourth means coupled to each signal source for producing a character present signal in response to the availability therefrom of a character representing signal,
fifth means responsive following the occurrence of a system timing pulse to the occurrence of a strobe enable signal and the character present signal associated with the priority signal occurring closest in time to said last mentioned timing pulse for causing said second means not to provide said strobe enable signal,
means for transferring the binary coded signals associated with said last named priority signal to said printer following the occurrence of a given following system timing pulse,
and means responsive to the completion of said last named transfer of said binary coded signals to said printer to cause said second means to provide said strobe enable signal.

* * * * *

UNITED STATES PATENT OFFICE
CERTIFICATE OF CORRECTION

Patent No. 3,950,731            Dated April 13, 1976

Inventor(s) Maurice J. Ouellette

It is certified that error appears in the above-identified patent and that said Letters Patent are hereby corrected as shown below:

Column 4, line 66, cancel "April 23, 1971"

Signed and Sealed this

Seventeenth Day of May 1977

[SEAL]

Attest:

RUTH C. MASON
*Attesting Officer*

C. MARSHALL DANN
*Commissioner of Patents and Trademarks*